US005781048A

United States Patent [19]
Nakao et al.

[11] Patent Number: 5,781,048
[45] Date of Patent: Jul. 14, 1998

[54] SYNCHRONOUS CIRCUIT CAPABLE OF PROPERLY REMOVING IN-PHASE NOISE

[75] Inventors: Takehiko Nakao; Shinichi Yoshioka, both of Yokohama, Japan

[73] Assignee: Kabushiki Kaisha Toshiba, Tokyo, Japan

[21] Appl. No.: 698,892

[22] Filed: Aug. 16, 1996

[30] Foreign Application Priority Data

Aug. 23, 1995 [JP] Japan ................................. 7-214584

[51] Int. Cl.⁶ .............................. H03K 5/13; H03K 5/00
[52] U.S. Cl. ........................ 327/157; 327/156; 327/148; 327/147; 331/17
[58] Field of Search .......................... 327/105, 107, 327/141, 147, 148, 156, 157, 309, 312, 321; 331/17, 11

[56] References Cited

U.S. PATENT DOCUMENTS 3,579,281  5/1971  Kam .............................. 327/107
5,475,326  12/1995  Masuda .......................... 327/157

*Primary Examiner*—Timothy P. Callahan
*Assistant Examiner*—Dinh Le
*Attorney, Agent, or Firm*—Loeb & Loeb LLP

[57] ABSTRACT

The synchronous circuit has: a phase comparator for comparing a feedback signal with an input reference signal to detect a phase difference and outputting a phase difference signal corresponding to the phase difference; a charge pump for outputting charge/discharge signals on the basis of the phase difference signal output from said phase comparator; a low-pass filter for changing a charge amount accumulated in a capacitor on the basis of the charge/discharge signals output from said charge pump and outputting control signals corresponding to the charge amount as differential signals; a voltage-controlled oscillator for changing an oscillation frequency of an output on the basis of the control signals output from said low-pass filter; a frequency divider for multiplying the output from said voltage-controlled oscillator and outputting the feedback signal; and fixing means arranged on an output side of said charge pump and operated, when the phase difference between the reference signal and the feedback signal is near a dead band of said phase comparator, such that levels of the charge/discharge signals output from said charge pump are fixed at predetermined levels. According to the synchronous circuit, troubles causes by the unbalance in charge/discharge operation performed by the change pump can be prevented.

12 Claims, 7 Drawing Sheets

SYNCHRONOUS CIRCUIT CAPABLE OF PROPERLY REMOVING IN-PHASE NOISE

BACKGROUND OF THE INVENTION

The present invention relates to a synchronous circuit and, more particularly, to a synchronous circuit such as a phase-locked loop (to be referred to as a PLL hereinafter) circuit.

In recent years, along with progresses in high-speed/large-capacity data communication or high-speed microprocessors, highly precise timing synchronization is required for synchronous circuits such as a PLL circuit.

FIG. 1 is a circuit diagram showing the basic arrangement of a PLL circuit associated with the present invention. An external reference signal 11R and a feedback signal 15A output from a frequency divider 15 are input to a phase comparator 11, and a phase difference between the two input signals is detected. As the phase comparator 11, a phase/frequency comparator which detects not only a phase shift but also a frequency difference may be used. When the phase comparator 11 detects that the feedback signal 15A is phase-delayed from the reference signal 11R, an output signal 11A is set in an active state only for a period proportional to the phase difference. Inversely, when it is detected that the feedback signal 15A is phase-advanced from the reference signal 11R, an output signal 11B is set in an active state only for a period proportional to the phase difference. The signal 11A is used to advance the phase of the feedback signal 15A and is generally called an UP signal. The signal 11B is used to delay the phase of the feedback signal 15A and is called a DOWN signal. The signal 11A is active low while the signal 11B is active high.

Upon receiving the signals 11A and 11B output from the phase comparator 11, a charge pump 12 charges/discharges a capacitor (not shown) in a low-pass filter 13 at the subsequent stage. More specifically, in the charge pump 12, a constant-current source I11, a P-channel transistor P11, an N-channel transistor N11, and a constant-current source I12 are serially connected between a power supply voltage Vcc terminal and a ground terminal. The signal 11A is input to the gate of the P-channel transistor P11, and the signal 11B is input to the gate of the N-channel transistor N11. When the signal 11A is active, i.e., at the low level, the P-channel transistor P11 is turned on to connect a node N12A to the power supply voltage Vcc terminal, so that charges are accumulated in the capacitor of a low-pass filter 13 connected to the node N12A. When the signal 11B is active, i.e., at the high level, the N-channel transistor N11 is turned on to ground the node N12A, so that the capacitor of the low-pass filter 13 is discharged.

In this manner, the charge/discharge operation performed by the charge pump 12 is integrated by the capacitor in the low-pass filter 13. A signal 13A having a level corresponding to the charge amount accumulated in the capacitor is output and supplied to a voltage-controlled oscillator (to be referred to as a VCO hereinafter) 14. The VCO 14 changes the oscillation frequency of an output signal 14A in accordance with the level of the input signal 13A. A frequency divider 15 multiplies the frequency of the signal 14A by 1/n (n is an integer of 1 or more) to generate the feedback signal 15A, and supplies the feedback signal 15A to the phase comparator 11. As a result, feedback is performed such that the phase of the feedback signal 15A generated by the PLL is locked with that of the reference signal 11R.

When a signal synchronized with the reference signal 11R is to be generated, the phase of the feedback signal is shifted from that of the reference signal because of two main factors, as will be described below.

First, the phase comparator 11 has a dead band. For an ideal phase comparator, when the phase difference between the signal generated by the synchronous circuit and the reference signal is "0", both the UP and DOWN signals are inactive. If even a small phase difference is present, one of the signals becomes active. However, an actual phase comparator has a range called a dead band where a phase difference smaller than a predetermined value cannot be detected.

Because of this dead band, when the phase difference between the feedback signal and the reference signal is present in the dead band, both the UP and DOWN signals output from the phase comparator 11 are set in an inactive state. As a result, the oscillation frequency of the signal 14A output from the VCO 14 does not change, so phase locking is not performed anymore. Therefore, when the two signals are in the dead band, the shift of the signal generated by the synchronous circuit from the reference signal is not decreased, resulting in a jitter.

The other factor is noise in the chip. Phase shifts caused by noise in the chip are more frequent than those caused by the above-described dead band of the phase shifter, and thus pose a more serious problem. A jitter measured in a stand-alone synchronous circuit is small, and the phase of the feedback signal is not so largely shifted from that of the reference signal. However, when the synchronous circuit is incorporated in a system, the jitter is greatly increased, and a large phase shift from the reference signal is caused. Conventionally, many synchronous circuit designers are troubled with this problem. A probable cause for this problem is that, when the power supply varies in the operation of another circuit in the system, or when a peripheral circuit formed on the same circuit board with the synchronous circuit is operated, noise enters the synchronous circuit through the circuit board.

To prevent noise generation caused by such a factor and prevent the oscillation frequency of a signal output from the VCO from varying, a technique is used in which the control signal 13A input to the VCO 14 is output as differential signals.

As shown in FIG. 2, an UP signal 21A, a DOWN signal 21C, and signals 21B and 21D which are obtained by inverting the UP and DOWN signals 21A and 21C, respectively, are output from a phase comparator 21 and supplied to a charge pump 22. In the charge pump 22, a constant-current source I21, a P-channel transistor P21, an N-channel transistor N21, and a constant-current source I22 are serially connected between a power supply voltage Vcc terminal and a ground terminal. Additionally, a P-channel transistor P22 and an N-channel transistor N22, which are serially connected, are connected between the constant-current source I21 and the constant-current source I22 to be parallel to the P-channel transistor P21 and the N-channel transistor N21. The UP signal 21A and the DOWN signal 21C are input to the gates of the P-channel transistor P21 and the N-channel transistor N21, respectively. The $\overline{\text{DOWN}}$ signal 21D and the $\overline{\text{UP}}$ signal 21B are input to the gates of the P-channel transistor P22 and the N-channel transistor N22, respectively. Differential signals 22A and 22B are output from a connection node between the drain of the P-channel transistor P21 and that of the N-channel transistor N21 and a connection node between the drain of the P-channel transistor P22 and that of the N-channel transistor N22, respectively.

A low-pass filter 23 performs a charge/discharge operation on the basis of the differential signals 22A and 22B output from the charge pump 22, generates control voltages 23A and 23B corresponding to the difference between the signals 22A and 22B, and supplies the control voltages 23A and 23B to a VCO 24. The VCO 24 outputs a signal 24A having an oscillation frequency based on the control voltages 23A and 23B. A frequency divider 25 multiplies the frequency of the signal 24A and outputs a feedback signal 25A to the phase comparator 21.

In this synchronous circuit, when the charge pump 22 outputs differential outputs to the low-pass filter 23, in-phase noise can be removed from the signals 23A and 23B generated by the low-pass filter 23.

However, it is impossible to generate the $\overline{\text{UP}}$ signal 21B and the DOWN signal 21D by completely inverting the UP signal 21A and the $\overline{\text{DOWN}}$ signal 21C. It is also impossible to cause the current amount on the charge side of the charge pump 12 to completely match that on the discharge side. For these reasons, the charge amount accumulated in the low-pass filter 23 by the charge pump 22 cannot match the discharge amount from the low-pass filter 23. Therefore, when the initial values of the differential signals 22A and 22B are set as ½ of the power supply voltage VDD, the levels of the signals 22A and 22B gradually come closer to the power supply potential VDD or ground potential Vss. Finally, the level of one of the signals comes closer to the power supply potential VDD side or the ground potential Vss side.

FIG. 3 shows a state wherein the discharge amount is larger than the charge amount, so that the levels of the signals 22A and 22B approach the ground potential Vss side with the elapse of time. As a result of this phenomenon, in-phase noise cannot be removed.

The charges in the capacitor in the low-pass filter 23 are gradually removed by a leakage current. For this reason, the levels of the output signals 23A and 23B from the low-pass filter 23 are also gradually lowered along with the elapse of time. Therefore, the level of one of the signals 23A and 23B finally comes closer to the ground potential Vss side.

As described above, the synchronous circuit shown in FIGS. 1 and 2 cannot properly remove in-phase noise from control signals to be input to the VCO.

SUMMARY OF THE INVENTION

It is, therefore, an object of the present invention to provide a synchronous circuit capable of properly removing in-phase noise.

According to the present invention, there is provided a synchronous circuit comprising a phase comparator for comparing a feedback signal with an input reference signal to detect a phase difference and outputting a phase difference signal, a charge pump for outputting charge/discharge signals on the basis of the phase difference signal, a low-pass filter for changing a charge amount accumulated in a capacitor on the basis of the charge/discharge signals and outputting control signals as differential signals, a voltage-controlled oscillator for changing an oscillation frequency of an output on the basis of the control signals, a frequency divider for multiplying the output from the voltage-controlled oscillator and outputting the feedback signal, and fixing means arranged on an output side of the charge pump.

The fixing means is operated when the phase difference between the reference signal and the feedback signal is near the dead band of the phase comparator, such that the levels of the charge/discharge signals output from the charge pump are fixed at predetermined levels.

The charge/discharge signals output from the charge pump may be differential signals. The fixing means may have first and second resistors connected between one output terminal of the charge pump and a power supply voltage terminal and between one output terminal and a ground voltage terminal, respectively, and third and fourth resistors connected between the other output terminal of the charge pump and the power supply voltage terminal and between the other terminal and the ground voltage terminal, respectively.

In place of the first to fourth resistors, first to fourth constant-current sources may be used.

The fixing means may comprise intermediate value generation means for generating an intermediate value between the control signals output from the low-pass filter, a comparator for comparing the intermediate value with an input reference value and outputting a comparison result, and control means for receiving the comparison result to perform control such that the intermediate value matches the reference value.

The intermediate means may have two resistors serially connected between one output terminal and the other output terminal of the low-pass filter, and output the intermediate value from a node for connecting the resistors. The comparator may receive the intermediate value at its one input terminal, receive the reference signal at its other input terminal, and output the comparison result from its output terminal. The control means may have a first constant-current source, a first P-channel transistor, a first N-channel transistor, and a second constant-current source, which are serially connected between a power supply voltage terminal and a ground voltage terminal, and a third constant-current source, a second P-channel transistor, a second N-channel transistor, and a fourth constant-current source, which are serially connected to each other between the power supply voltage terminal and the ground voltage terminal to be parallel to the first constant-current source, the first P-channel transistor, the first N-channel transistor, and the second constant-current source. The comparison result output from the comparator may be input to gates of the first and second P-channel transistors and gates of the first and second N-channel transistors. A node for connecting the drain of the first P-channel transistor and the drain of the first N-channel transistor may be connected to one output terminal of the charge pump, and a node for connecting the drain of the second P-channel transistor and the drain of the second N-channel transistor may be connected to the other output terminal of the charge pump. When the intermediate value is larger than the reference value, the levels of the charge/discharge signals output from the charge pump may be changed such that the charge amount in the low-pass filter is decreased. When the intermediate value is smaller than the reference value, the levels of the charge/discharge signals output from the charge pump may be changed such that the charge amount in the low-pass filter is increased.

The control signals output from the low-pass filter may be controlled such that the intermediate value between the control signals output from the low-pass filter matches the reference value. Alternatively, the charge/discharge signals output from the charge pump may be controlled such that the intermediate value between the charge/discharge signals matches the reference value.

DESCRIPTION OF PREFERRED EMBODIMENTS

Preferred embodiments of the present invention will be described below with reference to the accompanying drawings.

Figure 4:
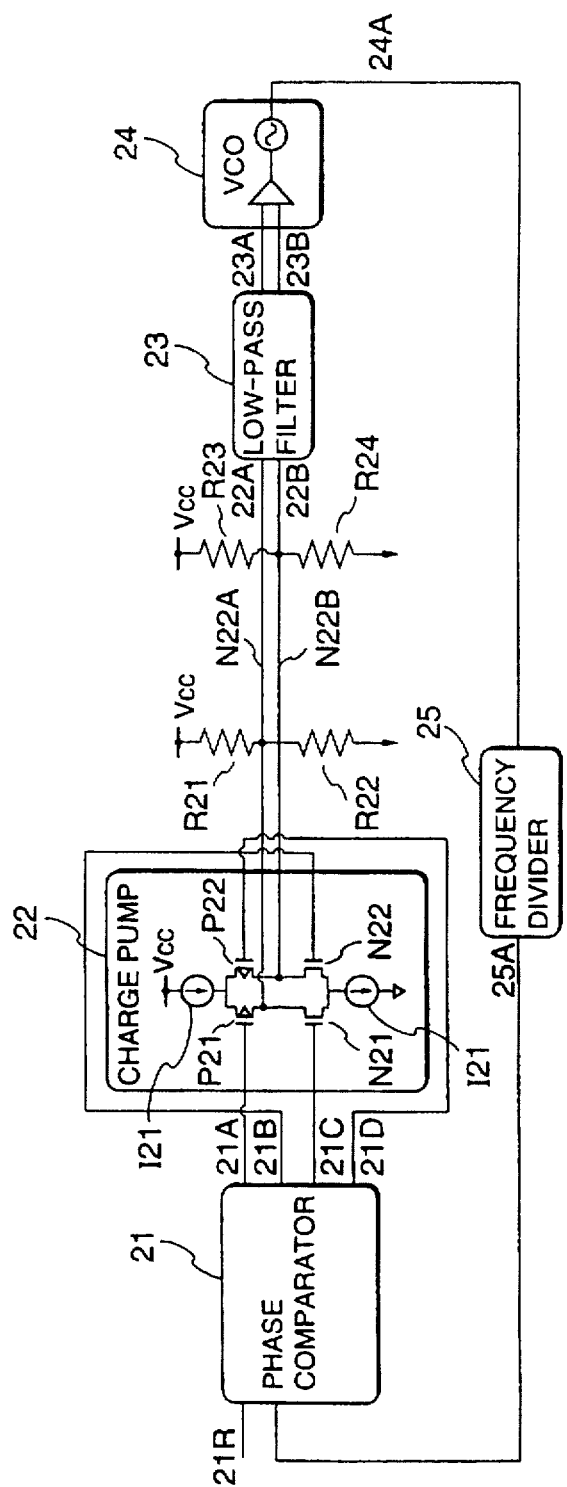
FIG. 4 is a circuit diagram showing the arrangement of a synchronous circuit according to the first embodiment of the present invention.

FIG. 4 is a circuit diagram showing the arrangement of a synchronous circuit according to the first embodiment. A phase comparator 21 outputs an UP signal 21A and a DOWN signal 21C, and signals 21B and 21C which are obtained by inverting the UP and DOWN signals 21A and 21C, and supplies these signals to a charge pump 22.

In the charge pump 22, a constant-current source I21, a P-channel transistor P21, an N-channel transistor N21, and a constant-current source I22 are serially connected between a power supply voltage Vcc terminal and a ground terminal. In addition, a P-channel transistor P22 and an N-channel transistor N22 are serially connected between the constant-current source I21 and the constant-current source I22 to be parallel to the P-channel transistor P21 and the N-channel transistor N21.

The UP signal 21A and the $\overline{\text{DOWN}}$ signal 21C are input to the gates of the P-channel transistor P21 and the N-channel transistor N21, respectively. The DOWN signal 21D and the $\overline{\text{UP}}$ signal 21B are input to the gates of the P-channel transistor P22 and the N-channel transistor N22, respectively. Differential signals 22A and 22B are output from the connection node between the drain of the P-channel transistor P21 and that of the N-channel transistor N21 and the connection node between the drain of the P-channel transistor P22 and that of the N-channel transistor N22, respectively.

A resistor R21 is connected between the power supply voltage Vcc terminal and a node N22A for outputting the signal 22A from the charge pump 22. A resistor R22 is connected between the node N22A and the ground voltage Vss terminal. Similarly, a resistor R23 is connected between the power supply voltage VCC terminal and a node N22B for outputting the signal 22B from the charge pump 22. A resistor R24 is connected between the node N22B and the ground voltage Vss terminal.

A low-pass filter 23 performs a charge/discharge operation on the basis of the differential signals 22A and 22B output from the charge pump 22, generates control voltages 23A and 23B corresponding to the difference between the signals 22A and 22B, and supplies the control voltages 23A and 23B to a VCO 24.

The VCO 24 outputs a signal 24A having an oscillation frequency based on the control voltages 23A and 23B. A frequency divider 25 multiplies the frequency of the signal 24A and outputs a feedback signal 25A to the phase comparator 21.

According to this embodiment, the resistors R21 to R24 are added to the output side of the charge pump 22. With this arrangement, the following functions and effects are obtained.

Figure 2:
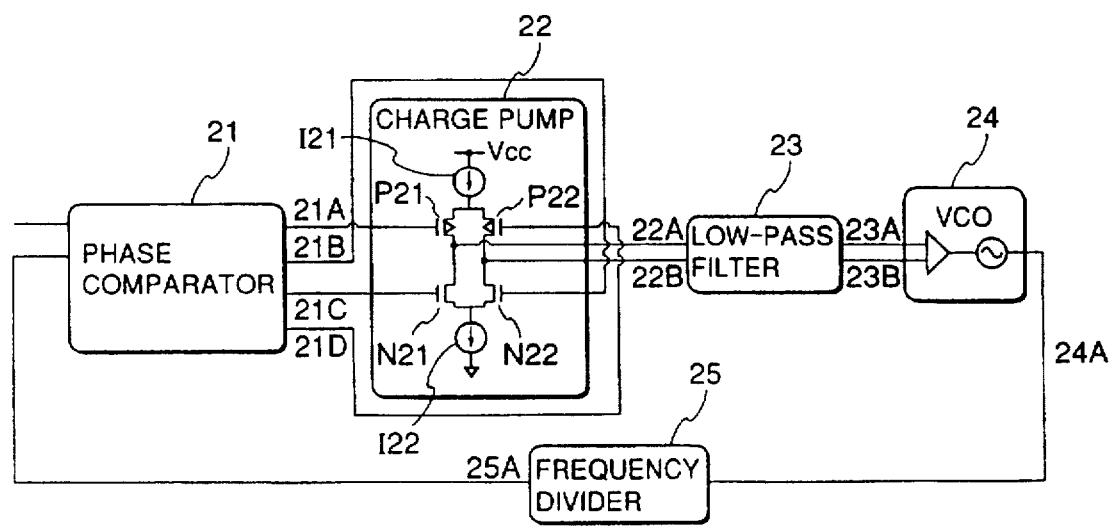
FIG. 2 is a circuit diagram showing the arrangement of another synchronous circuit.
Figure 3:
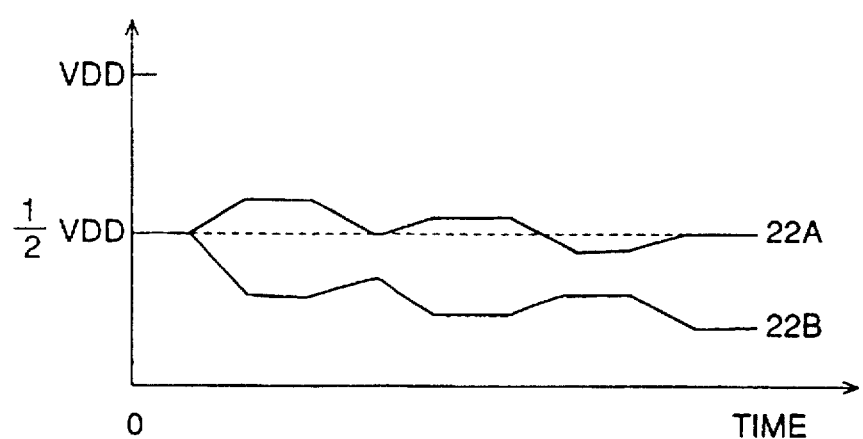
FIG. 3 is an explanatory view showing changes in levels of signals in the synchronous circuits shown in FIGS. 1 and 2.

As described above, the signals 21A and 21C, and the signals 21D and 21B which are obtained by inverting the signals 21C and 21A are input from the phase comparator 21 to the gates of the transistors P21 and N21, and the transistors P22 and N22 of the charge pump 22, respectively. The ON/OFF operations of the transistors P21, N21, P22, and N22 are controlled on the basis of the signals 21A, 21C, 21B, and 21D, respectively. In the circuit shown in FIG. 2, when all the transistors are in an OFF state, i.e., when both the output signals 22A and 22B from the charge pump 22 are inactive, the levels of the signals approach the power supply potential VDD or the ground potential Vss.

In this embodiment, however, the resistors R21 and R22 and the resistors R23 and R24 are connected to the output nodes N22A and N22B. For this reason, when both the output signals 22A and 22B from the charge pump 22 are inactive, the signals are fixed at levels represented by equations (1) and (2), respectively:

$$V22A = Vcc * R21/(R21+R22) \quad (1)$$

$$V22B = Vcc * R23/(R23+R24) \quad (2)$$

When a phase difference is present between a reference signal 21R and the output signal 25A from the frequency divider 25, which is generated by the synchronous circuit, a potential difference is present between the output signals 22A and 22B from the charge pump 22. When the phase difference between the signal 25A and the reference signal 21R is decreased, the phase difference enters the dead band of the phase comparator 21. As a result, all the signals 21A to 21D output from the phase comparator 21 become inactive, so that all the transistors P21, N21, P22, and N22 of the charge pump 22 are turned off. However, since the resistors R21 to R24 are added, the levels of the output signals 22A and 22B from the charge pump 22 tend to return to the levels represented by equations (1) and (2). The potential difference between the signals 22A and 22B varies to change the oscillation frequency of the VC0 24 accordingly. A phase difference outside the dead band is generated between the feedback signal 25A and the reference signal 21R. This phase difference is detected again by the phase comparator 21, so that the charge pump 22 shifts to an active state.

As described above, the charge/discharge operation performed when the phase comparator 21 detects a phase difference is balanced with the charge/discharge operation performed when the levels of the signals 22A and 22B are fixed by the resistors R21 to R24. At this point of time, this synchronous circuit reaches a stable state.

Therefore, the level of the signal 22A or 22B is prevented from approaching the power supply potential Vcc or the ground potential Vss.

Figure 5:
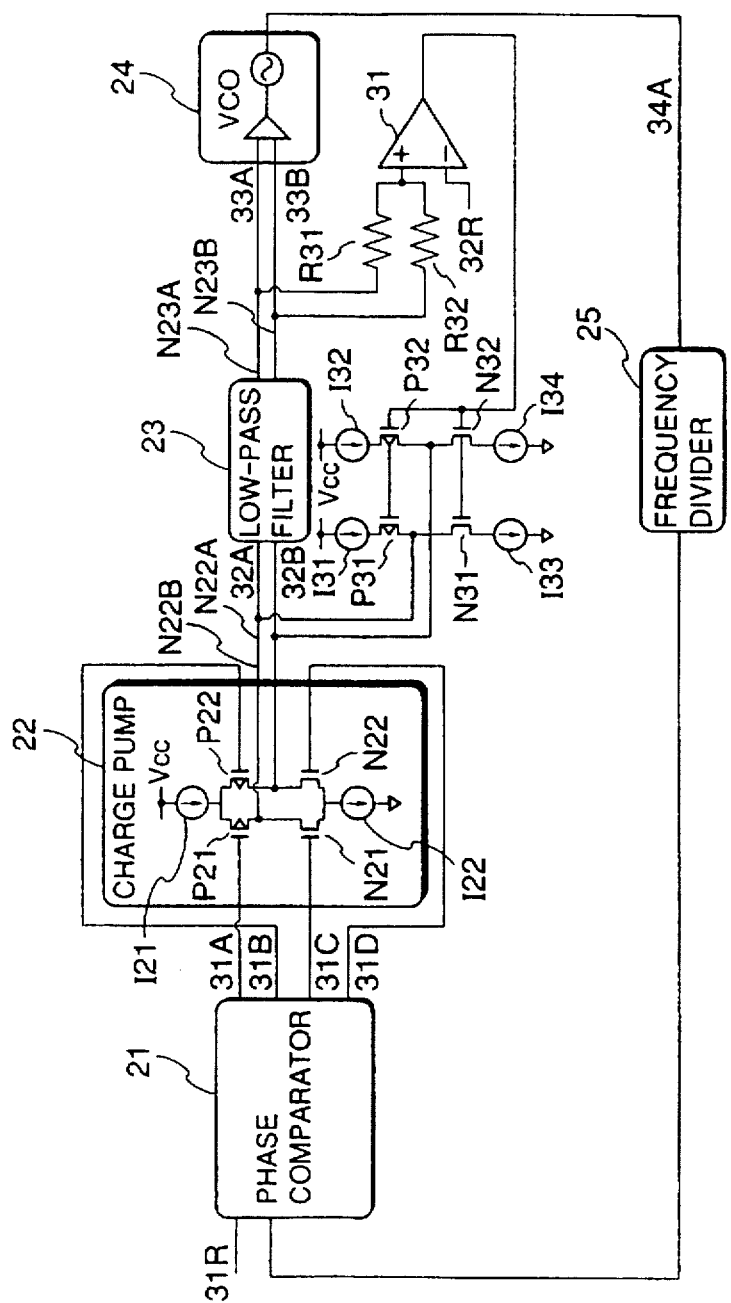
FIG. 5 is a circuit diagram showing the arrangement of a synchronous circuit according to the second embodiment of the present invention.

FIG. 5 is a circuit diagram showing the arrangement of a synchronous circuit according to the second embodiment. This synchronous circuit has the circuit shown in FIG. 2, to which the following circuit is added to the output nodes of a charge pump 22 and a low-pass filter 23, instead of the resistors R21 to R24. Resistors R31 and R32 are serially connected between an output nodes N23A and N23B of the low-pass filter 23. A node for connecting the resistor R31 and the resistor R32 is connected to the non-inverting input terminal of a comparator 31. A reference signal 32R is input to the inverting input terminal of the comparator 31.

A constant-current source I31, a P-channel transistor P31, an N-channel transistor N31, and a constant-current source I33 are serially connected between the power supply voltage Vcc terminal and the ground voltage Vss terminal. Similarly, a constant-current source I32, a P-channel transistor P32, an N-channel transistor N32, and a constant-current source I34 are serially connected between the power supply voltage Vcc terminal and the ground voltage Vss terminal. The gates of the transistors P31, P32, N31, and N32 are connected to the output terminal of the comparator 31. A node for connecting the drain of the transistor P31 to that of the transistor N31 and a node for connecting the drain of the transistor P32 to that of the transistor N32 are connected to output nodes N22A and N22B of the charge pump 22, respectively.

Figure 1:
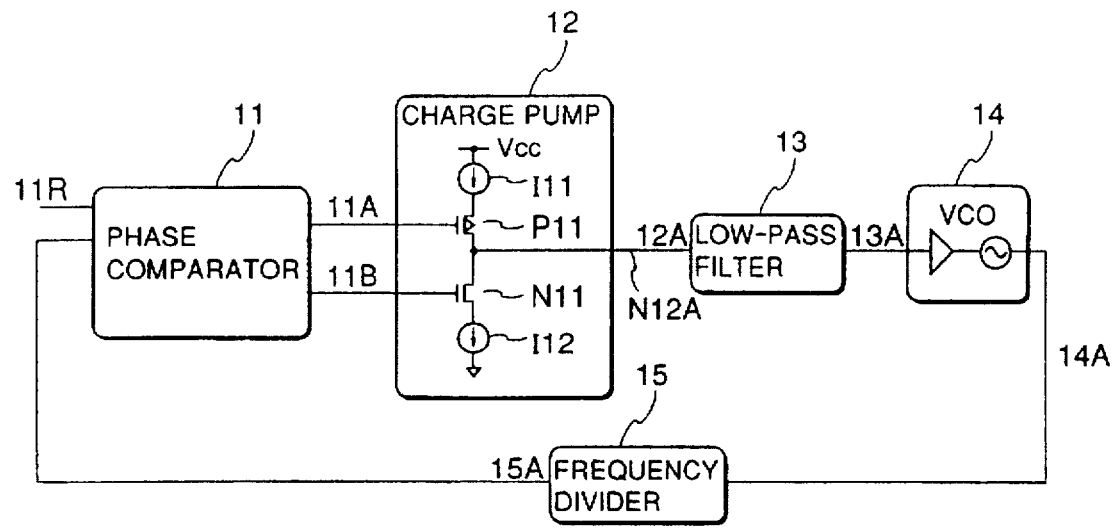
FIG. 1 is a circuit diagram showing the arrangement of a synchronous circuit.

The same reference numerals as in FIG. 1 denote the same elements in FIG. 5. In this second embodiment, the following functions and effects are obtained.

An intermediate potential between the potentials of output signals 33A and 33B from the low-pass filter 23 is generated at the connection node between the resistors R31 and R32. This intermediate potential is compared with the reference voltage 32R by the comparator 31. When the intermediate potential between the signals 33A and 33B is larger than the reference voltage 32R, a logic signal of high level is output from the comparator 31. When this signal is input to the gates of the transistors P31, N31, P32, and N32, the conductive resistances of the N-channel transistors N31 and N32 become lower than those of the P-channel transistors P31 and P32, so that the levels of the output nodes N22A and N22B are lowered to the ground voltage Vss side. Inversely, when the intermediate potential between the output signals 33A and 33B is smaller than the reference voltage 32R, a logic signal of low level is output from the comparator 31. When this signal is input to the gates of the transistors P31, N31, P32, and N32, the conductive resistances of the P-channel transistors P31 and P32 become lower than those of the N-channel transistors N31 and N32, so that the levels of the output nodes N22A and N22B are raised to the power supply voltage Vcc side.

As a result, the levels of the output signals 32A and 32B from the charge pump 22 are adjusted such that the intermediate potential between the two output signals 33A and 33B from the low-pass filter 23 matches the reference voltage 32R. Therefore, according to this embodiment as well, as in the first embodiment, the level of one of the output signals 33A and 33B from the low-pass filter 23 is prevented from approaching the power supply voltage Vcc or the ground voltage Vss, and in-phase noise can be properly removed.

In the second embodiment, the intermediate potential between the output signals 33A and 33B from the low-pass filter 23 is detected, and the levels of the output signals 32A and 32B from the charge pump 22 are controlled such that the intermediate potential matches the reference voltage 32R.

Figure 6:
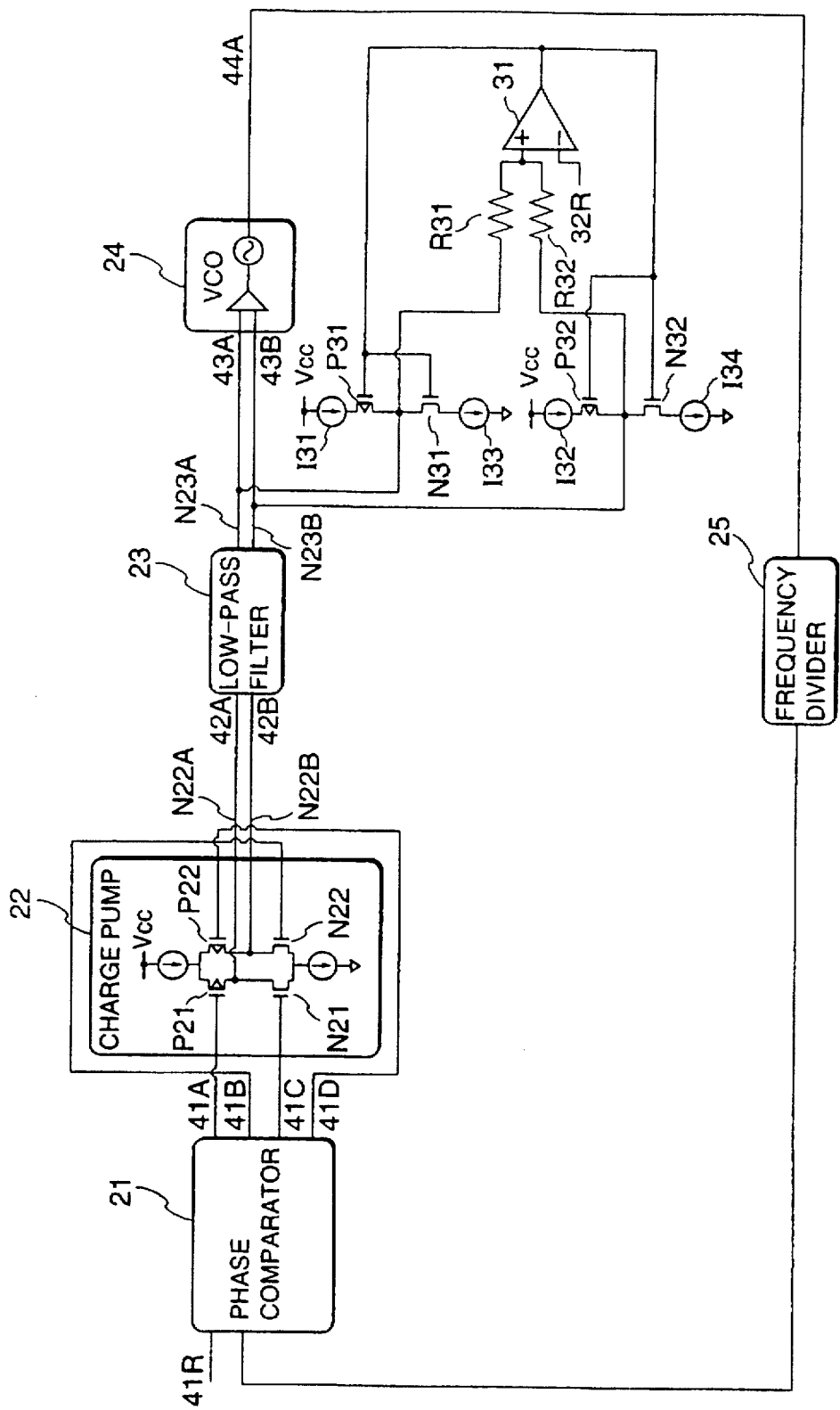
FIG. 6 is a circuit diagram showing the arrangement of a synchronous circuit according to the third embodiment of the present invention.

In the third embodiment, as shown in FIG. 6, the levels of output signals 43A and 43B from a low-pass filter 23 are controlled such that the intermediate potential between the output signals 43A and 43B from the low-pass filter 23 matches a reference voltage 32R. The signals 42A and 42B are input to low-pass filter 23, which outputs signals 43A and 43B. Signals 43A and 43B are received by VCO 24 which outputs signal 44A to frequency divider 25. Node N23A is connected to the node between P-transistor P31 and N-transistor N31 and to the resistor R31, and node N23B is connected to the node between P-transistor P32 and N-transistor N32 and to resistor R32. According to this embodiment as well, the level of one of the signals 43A and 43B is prevented from approaching the power supply voltage Vcc or a ground voltage Vss. However, when the second embodiment is compared with the third embodiment, the second embodiment provides a larger effect of removing in-phase noise. The reason for this is as follows. In the second embodiment, switching noise generated upon switching the ON/OFF states of the transistors P31, N31, P32, and N32 is applied to the input side of the low-pass filter 23, and such noise is removed from the output signals 43A and 43B from the low-pass filter 23.

Figure 7:
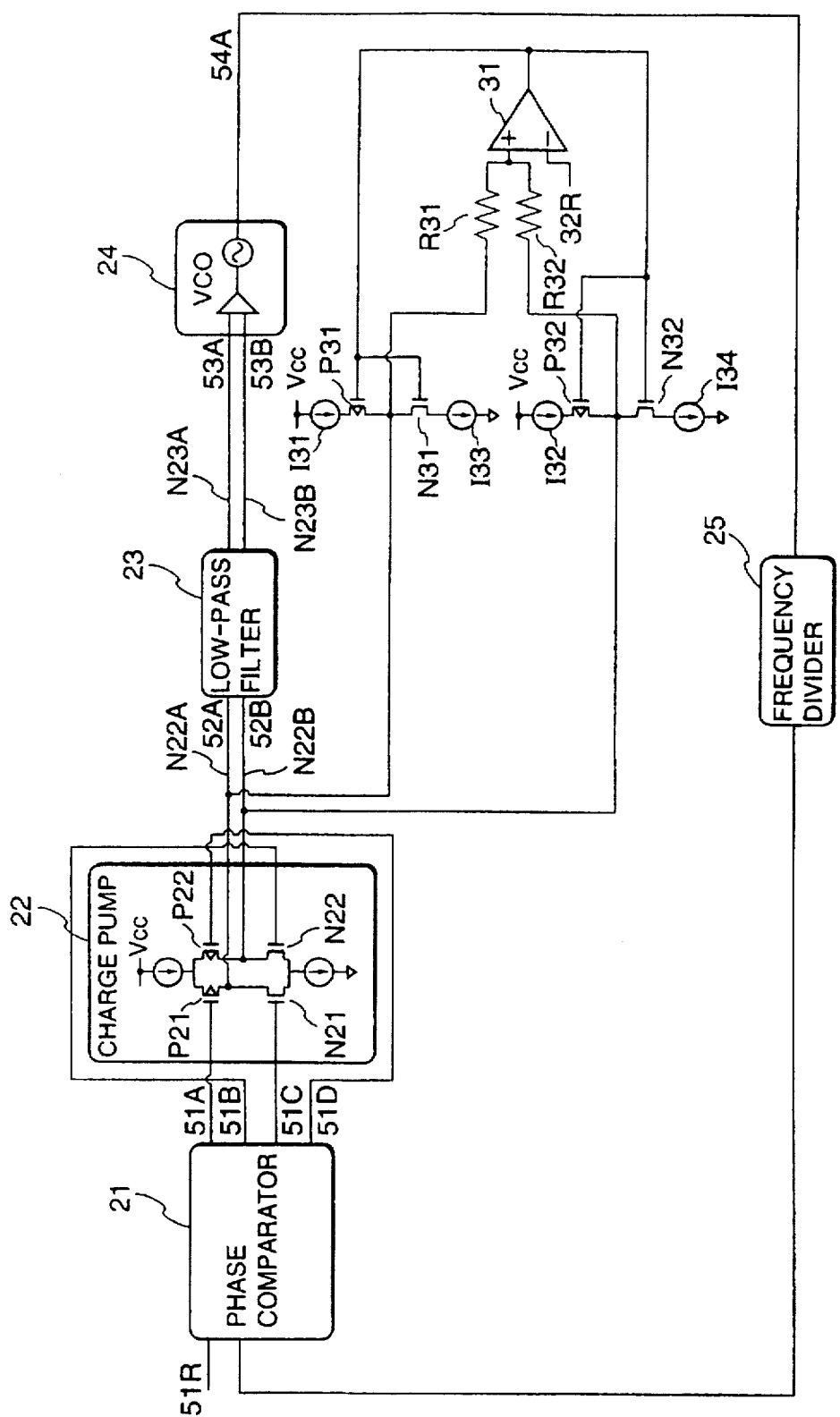
FIG. 7 is a circuit diagram showing the arrangement of a synchronous circuit according to the fourth embodiment of the present invention.

A synchronous circuit according to the fourth embodiment has an arrangement as shown in FIG. 7. In this embodiment, the levels of signals 52A and 52B output from output nodes N22A and N22B of a charge pump 22 are controlled such that the intermediate potential between the signals 52A and 52B matches a reference voltage 32R. The signals 52A and 52B are input to low-pass filter 23, which outputs signals 53A and 53B. Signals 53A and 53B are received by VCO 24 which outputs signal 54A to frequency divider 25. Node N22A is connected to the node between P-transistor P31 and N-transistor N31 and to the resistor R31, and node N22B is connected to the node between P-transistor P32 and Ntransistor N32 and to resistor R32. According to this embodiment as well, the level of one of output signals 53A and 53B from a low-pass filter 23 is prevented from approaching the power supply voltage Vcc or the ground voltage Vss. However, when the second embodiment is compared with the fourth embodiment, the second embodiment provides a larger effect of removing in-phase noise. In the fourth embodiment, the intermediate potential between the output signals 52A and 52B from the charge pump 22, which includes noise, is compared with the reference voltage 32R. In the second embodiment, the intermediate potential between the output signals 53A and 53B from the low-pass filter 23, from which noise is removed, is compared with the reference voltage 32R. Therefore, the levels of the input signals 33A and 33B to the VCO 24 can be controlled on the basis of a more accurate comparison result.

In the first embodiment, since the resistors R21 to R24 are connected to the output nodes N22A and N22B of the charge pump 22, a current flows from the power supply voltage Vcc terminal to the ground voltage Vss terminal. In the second to fourth embodiments, since the resistors R31 and R32 are connected to the output side of the charge pump 22 or the output side of the low-pass filter, a current flows to the resistors R31 and R32.

As described above, according to the embodiments of the present invention, a current for controlling the oscillation center potential between the output signals from the low-pass filter flows. When this current is too large, the phase difference detected by the phase comparator 21 becomes large. The current amount of the charge/discharge operation by the charge pump 22 may increase, resulting in an increase in jitter. Therefore, the current for controlling the oscillation center potential must be much smaller than the charge/discharge current supplied from the charge pump 22, e.g., 1/10 the charge/discharge current.

The above-described embodiments are examples and the present invention is not limited to these embodiments. FIGS.

Figure 8:
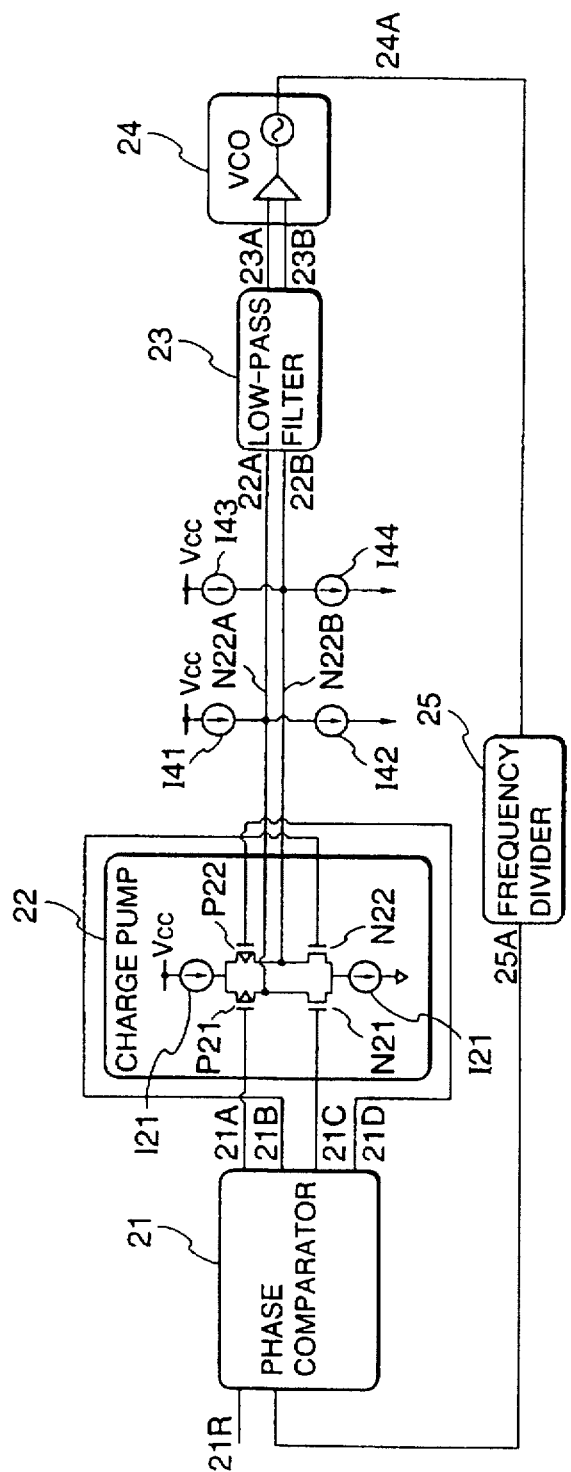
FIG. 8 is a circuit diagram showing the arrangement of a synchronous circuit according to the fifth embodiment of the present invention.

4 to 7 show examples of circuit arrangements. As far as the oscillation center potential between the differential output signals from the low-pass filter can be controlled to match the reference potential, various changes and modifications can be made. For example, as in the fifth embodiment shown in FIG. 8, four constant-current sources I41 to I44 may be connected in place of the resistors R21 to R24 in the synchronous circuit shown in FIG. 4.

As has been described above, an unbalance in the charge/discharge operation performed by the charge pump, or an unbalance in a control signal, which is caused by a leakage of the charge accumulated in the capacitor in the low-pass filter, can be prevented by the synchronous circuit of the present invention by controlling the intermediate value between outputs from the low-pass filter or the charge pump such that the intermediate value matches a reference value, so that in-phase noise can be removed.

What is claimed is:

1. A synchronous circuit comprising:

a phase comparator for comparing a feedback signal with an input reference signal to detect a phase difference and for outputting a phase difference signal corresponding to the phase difference;

a charge pump for outputting charge/discharge signals on the basis of the phase difference signal output from said phase comparator;

a low-pass filter for changing a charge amount accumulated in a capacitor on the basis of the charge/discharge signals output from said charge pump and for outputting control signals corresponding to the charge amount as differential signals;

a voltage-controlled oscillator for changing an oscillation frequency of an output on the basis of the control signals output from said low-pass filter;

a frequency divider for dividing the output from said voltage-controlled oscillator in order to output the feedback signal;

intermediate value generation means for generating an intermediate value between the control signals output from said low-pass filter;

a comparator for comparing the intermediate value output from said intermediate value generation means with an externally input reference value and for outputting a comparison result; and control means for receiving the comparison result output by said comparator and for controlling levels of the charge/discharge signals output from said charge pump so that the intermediate value is made to match the externally input reference value.

2. The synchronous circuit according to claim 1, wherein said intermediate value generation means has two resistors serially connected between one output terminal and the other output terminal of said low-pass filter, the intermediate value generation means outputting the intermediate value from a first node that connects said two resistors, one input terminal of the comparator receives the intermediate value output from said intermediate value generation means, another input terminal of the comparator receives the externally input reference value, and the comparison result is output from an output terminal of the comparator, and said control means includes:

a first constant-current source, a first P-channel transistor, a first N-channel transistor, and a second constant-current source that are serially connected between a power supply voltage terminal and a ground voltage terminal; and a third constant-current source, a second P-channel transistor, a second N-channel transistor, and a fourth constant-current source that are serially connected between said power supply voltage terminal and said ground voltage terminal, so as to be parallel to said first constant-current source, said first P-channel transistor, said first N-channel transistor, and said second constant-current source, wherein the comparison result output from said comparator is input to gates of said first and second P-channel transistors and gates of said first and second N-channel transistors, a second node that connects a drain of said first P-channel transistor and a drain of said first N-channel transistor is connected to one output terminal of said charge pump, a third node that connects a drain of said second P-channel transistor and a drain of said second N-channel transistor is connected to the other output terminal of said charge pump, when the intermediate value is larger than the externally input reference value, the levels of the charge/discharge signals output from said charge pump are changed such that the charge amount in said low-pass filter is decreased, and when the intermediate value is smaller than the externally input reference value, the levels of the charge/discharge signals output from said charge pump are changed such that the charge amount in said low-pass filter is increased.

3. The synchronous circuit according to claim 1, wherein the intermediate value is received at a non-inverting input terminal of the comparator, the externally input reference value is received at an inverting input terminal of the comparator, a signal of high level is output from an output terminal of the comparator when the intermediate value is larger than the externally input reference value, and a signal of low level is output from said output terminal when the intermediate value is smaller than the externally input reference value, said control means includes:

a first constant-current source, a first P-channel transistor, a first N-channel transistor, and a second constant-current source that are serially connected between a power supply voltage terminal and a ground voltage terminal; and a third constant-current source, a second P-channel transistor, a second N-channel transistor, and a fourth constant-current source that are serially connected to each other between said power supply voltage terminal and said ground voltage terminal, so as to be parallel to said first constant-current source, said first P-channel transistor, said first N-channel transistor, and said second constant-current source, the signal of high or low level output from said comparator is input to gates of said first and second P-channel transistors and gates of said first and second N-channel transistors, a first node that connects a drain of said first P-channel transistor and a drain of said first N-channel transistor is connected to one output terminal of said charge pump, a second node that connects a drain of said second P-channel transistor and a drain of said second N-channel transistor is connected to the other output terminal of said charge pump, when the intermediate value is larger than the externally input reference value, the signal of high level is output from said comparator so that conductive resistances of said first and second N-channel transistors become lower than conductive resistances of said first and second P-channel transistors, and the levels of the charge/discharge signals output from said charge pump are lowered to decrease the charge amount in said low-pass filter, and when the intermediate value is smaller than the externally input reference value, the signal of low level is output from said comparator so that conductive resistances of said first and second N-channel transistors become higher than conductive resistances of said first and second P-channel transistors, and the levels of the charge/discharge signals output from said charge pump are raised to increase the charge amount in said low-pass filter.

4. A synchronous circuit comprising:

a phase comparator for comparing a feedback signal with an input reference signal to detect a phase difference and for outputting a phase difference signal corresponding to the phase difference;

a charge pump for outputting charge/discharge signals on the basis of the phase difference signal output from said phase comparator;

a low-pass filter for changing a charge amount accumulated in a capacitor on the basis of the charge/discharge signals output from said charge pump and for outputting control signals corresponding to the charge amount as differential signals;

a voltage-controlled oscillator for changing an oscillation frequency of an output on the basis of the control signals output from said low-pass filter;

a frequency divider for dividing the output from said voltage-controlled oscillator in order to output the feedback signal;

intermediate value generation means for generating an intermediate value between the control signals output from said low-pass filter;

a comparator for comparing the intermediate value output from said intermediate value generation means with an externally input reference value and for outputting a comparison result; and control means for receiving the comparison result output by said comparator and for controlling levels of the control signals output from said low-pass filter so that the intermediate value is made to match the externally input reference value.

5. The synchronous circuit according to claim 4, wherein said intermediate value generation means has two resistors serially connected between one output terminal and the other output terminal of said low-pass filter, the intermediate value generation means outputting the intermediate value from a first node that connects said two resistors, one input terminal of the comparator receives the intermediate value output from said intermediate value generation means, another input terminal of the comparator receives the externally input reference value, and the comparison result is output from an output terminal of the comparator, and said control means includes:

a first constant-current source, a first P-channel transistor, a first N-channel transistor, and a second constant-current source that are serially connected between a power supply voltage terminal and a ground voltage terminal; and a third constant-current source, a second P-channel transistor, a second N-channel transistor, and a fourth constant-current source that are serially connected between said power supply voltage terminal and said ground voltage terminal, so as to be parallel to said first constant-current source, said first P-channel transistor, said first N-channel transistor, and said second constant-current source, wherein the comparison result output from said comparator is input to gates of said first and second P-channel transistors and gates of said first and second N-channel transistors, a second node that connects a drain of said first P-channel transistor and a drain of said first N-channel transistor is connected to one output terminal of said low-pass filter, a third node that connects a drain of said second P-channel transistor and a drain of said second N-channel transistor is connected to the other output terminal of said low-pass filter, when the intermediate value is larger than the externally input reference value, the levels of the control signals output from said low-pass filter are changed as in a case in which the charge amount in said low-pass filter is decreased, and when the intermediate value is smaller than the externally input reference value, the levels of the control signals output from said low-pass filter are changed as in a case in which the charge amount in said low-pass filter is increased.

6. The synchronous circuit according to claim 4, wherein the intermediate value is received at a non-inverting input terminal of the comparator, the externally input reference value is received at an inverting input terminal of the comparator, a signal of high level is output from an output terminal of the comparator when the intermediate value is larger than the externally input reference value, and a signal of low level is output from said output terminal when the intermediate value is smaller than the externally input reference value, said control means includes:

a first constant-current source, a first P-channel transistor, a first N-channel transistor, and a second constant-current source that are serially connected between a power supply voltage terminal and a ground voltage terminal; and a third constant-current source, a second P-channel transistor, a second N-channel transistor, and a fourth constant-current source that are serially connected between said power supply voltage terminal and said ground voltage terminal, so as to be parallel to said first constant-current source, said first P-channel transistor, said first N-channel transistor, and said second constant-current source, the signal of high or low level output from said comparator is input to gates of said first and second P-channel transistors and gates of said first and second N-channel transistors, a first node that connects a drain of said first P-channel transistor and a drain of said first N-channel transistor is connected to one output terminal of said low-pass filter, a second node that connects a drain of said second P-channel transistor and a drain of said second N-channel transistor is connected to the other output terminal of said low-pass filter, when the intermediate value is larger than the externally input reference value, the signal of high level is output from said comparator so that conductive resistances of said first and second N-channel transistors become lower than conductive resistances of said first and second P-channel transistors, and the levels of the control signals output from said low-pass filter are lowered as in a case in which the charge amount in said low-pass filter is decreased, and when the intermediate value is smaller than the externally input reference value, the signal of low level is output from said comparator so that conductive resistances of said first and second N-channel transistors become higher than conductive resistances of said first and second P-channel transistors, and the levels of the control signals output from said low-pass filter are raised as in a case in which the charge amount in said low-pass filter is increased.

7. A synchronous circuit comprising:

a phase comparator for comparing a feedback signal with an input reference signal to detect a phase difference and for outputting a phase difference signal corresponding to the phase difference;

a charge pump for outputting charge/discharge signals on the basis of the phase difference signal output from said phase comparator;

a low-pass filter for changing a charge amount accumulated in a capacitor on the basis of the charge/discharge signals output from said charge pump and for outputting control signals corresponding to the charge amount as differential signals;

a voltage-controlled oscillator for changing an oscillation frequency of an output on the basis of the control signals output from said low-pass filter;

a frequency divider for dividing the output from said voltage-controlled oscillator in order to output the feedback signal;

intermediate value generation means for generating an intermediate value between the charge/discharge signals output from said charge pump;

a comparator for comparing the intermediate value output from said intermediate value generation means with an externally input reference value and for outputting a comparison result; and control means for receiving the comparison result output by said comparator and for controlling levels of the charge/discharge signals output from said charge pump so that the intermediate value is made to match the externally input reference value.

8. The synchronous circuit according to claim 7, wherein said intermediate value generation means has two resistors serially connected between one output terminal and the other output terminal of said charge pump, the intermediate value generation means outputting the intermediate value from a first node that connects said two resistors, one input terminal of the comparator receives the intermediate value output from said intermediate value generation means, another input terminal of the comparator receives the externally input reference value, and the comparison result is output from an output terminal of the comparator, and said control means includes:

a first constant-current source, a first P-channel transistor, a first N-channel transistor, and a second constant-current source that are serially connected between a power supply voltage terminal and a ground voltage terminal; and a third constant-current source, a second P-channel transistor, a second N-channel transistor, and a fourth constant-current source that are serially connected between said power supply voltage terminal and said ground voltage terminal, so as to be parallel to said first constant-current source, said first P-channel transistor, said first N-channel transistor, and said second constant-current source, wherein the comparison result output from said comparator is input to gates of said first and second P-channel transistors and gates of said first and second N-channel transistors, a second node that connects a drain of said first P-channel transistor and a drain of said first N-channel transistor is connected to one output terminal of said charge pump, a third node that connects a drain of said second P-channel transistor and a drain of said second N-channel transistor is connected to the other output terminal of said charge pump, when the intermediate value is larger than the externally input reference value, the levels of the charge/discharge signals output from said charge pump are changed such that the charge amount in said low-pass filter is decreased, and when the intermediate value is smaller than the externally input reference value, the levels of the charge/discharge signals output from said charge pump are changed such that the charge amount in said low-pass filter is increased.

9. The synchronous circuit according to claim 7, wherein the intermediate value is received at a non-inverting input terminal of the comparator, the externally input reference value is received at an inverting input terminal of the comparator, a signal of high level is output from an output terminal of the comparator when the intermediate value is larger than the externally input reference value, and a signal of low level is output from said output terminal when the intermediate value is smaller than the externally input reference value, said control means includes:

a first constant-current source, a first P-channel transistor, a first N-channel transistor, and a second constant-current source that are serially connected between a power supply voltage terminal and a ground voltage terminal; and a third constant-current source, a second P-channel transistor, a second N-channel transistor, and a fourth constant-current source that are serially connected between said power supply voltage terminal and said ground voltage terminal, so as to be parallel to said first constant-current source, said first P-channel transistor, said first N-channel transistor, and said second constant-current source, the signal of high or low level output from said comparator is input to gates of said first and second P-channel transistors and gates of said first and second N-channel transistors, a first node that connects a drain of said first P-channel transistor and a drain of said first N-channel transistor is connected to one output terminal of said charge pump, a second node that connects a drain of said second P-channel transistor and a drain of said second N-channel transistor is connected to the other output terminal of said charge pump, when the intermediate value is larger than the externally input reference value, the signal of high level is output from said comparator so that conductive resistances of said first and second N-channel transistors become lower than conductive resistances of said first and second P-channel transistors, and the levels of the charge/discharge signals output from said charge pump are lowered to decrease the charge amount in said low-pass filter, and when the intermediate value is smaller than the externally input reference value, the signal of low level is output from said comparator so that conductive resistances of said first and second N-channel transistors become higher than conductive resistances of said first and second P-channel transistors, and the levels of the charge/discharge signals output from said charge pump are raised to increase the charge amount in said low-pass filter.

10. A synchronous circuit comprising:

a phase comparator;

a charge pump circuit connected to said phase comparator:

a low-pass filter connected to said charge pump circuit;

a voltage-level fixing circuit connected to at least one of an output of said charge pump circuit and an output of said low-pass filter;

a voltage-controlled oscillator connected to said low-pass filter; and a frequency divider connected to said voltage-controlled oscillator, wherein said charge pump circuit outputs first and second signals on first and second output lines, said low-pass filter outputs third and fourth signals on third and fourth output lines, and said voltage-level fixing circuit includes:

an intermediate voltage generating circuit connected to said third and fourth output lines;

a comparator having a first input connected to said intermediate voltage generating circuit and a second input connected to a reference voltage;

a first switch circuit having an input connected to an output of said comparator and an output connected to said first output line of said charge pump circuit; and a second switch circuit having an input connected to said output of said comparator and an output connected to said second output line of said charge pump circuit.

11. A synchronous circuit comprising:

a phase comparator;

a charge pump circuit connected to said phase comparator;

a low-pass filter connected to said charge pump circuit, a voltage-level fixing circuit connected to at least one of an output of said charge pump circuit and an output of said low-pass filter;

a voltage-controlled oscillator connected to said low-pass filter; and a frequency divider connected to said voltage-controlled oscillator, wherein said low-pass filter outputs first and second signals on first and second output lines, and said voltage-level fixing circuit includes:

an intermediate voltage generating circuit connected to said first and second output lines;

a comparator having a first input connected to said intermediate voltage generating circuit and a second input connected to a reference voltage;

a first switch circuit having an input connected to an output of said comparator and an output connected to said first output line of said low-pass filter; and a second switch circuit having an input connected to said output of said comparator and an output connected to said second output line of said low-pass filter.

12. A synchronous circuit comprising:

a phase comparator;

a charge pump circuit connected to said phase comparator;

a low-pass filter connected to said charge pump circuit;

a voltage-level fixing circuit connected to at least one of an output of said charge pump circuit and an output of said low-pass filter;

a voltage-controlled oscillator connected to said low-pass filter; and a frequency divider connected to said voltage-controlled oscillator, wherein said charge pump circuit outputs first and second signals on first and second output lines, and said voltage-level fixing circuit includes:

an intermediate voltage generating circuit connected to said first and second output lines;

a comparator having a first input connected to said intermediate voltage generating circuit and a second input connected to a reference voltage;

a first switch circuit having an input connected to an output of said comparator and an output connected to said first output line of said charge pump circuit; and a second switch circuit having an input connected to said output of said comparator and an output connected to said second output line of said charge pump circuit.

* * * * *